(12) United States Patent
Kubota

(10) Patent No.: US 8,116,099 B2
(45) Date of Patent: Feb. 14, 2012

(54) CIRCUIT BOARD DEVICE, ELECTRONIC DEVICE PROVIDED WITH THE SAME, AND GND CONNECTING METHOD

(75) Inventor: Akihito Kubota, Saitama (JP)

(73) Assignee: NEC Corporation, Tokyo (JP)

( * ) Notice: Subject to any disclaimer, the term of this patent is extended or adjusted under 35 U.S.C. 154(b) by 225 days.

(21) Appl. No.: 12/374,358

(22) PCT Filed: Jul. 18, 2007

(86) PCT No.: PCT/JP2007/064186
§ 371 (c)(1),
(2), (4) Date: Jan. 19, 2009

(87) PCT Pub. No.: WO2008/010518
PCT Pub. Date: Jan. 24, 2008

(65) Prior Publication Data
US 2010/0014267 A1    Jan. 21, 2010

(30) Foreign Application Priority Data

Jul. 20, 2006   (JP) ................................. 2006-198386

(51) Int. Cl.
*H05K 1/11* (2006.01)
(52) U.S. Cl. ........ 361/803; 361/721; 361/727; 361/729; 361/730; 361/749; 361/753; 361/784; 361/800; 361/816; 361/818; 174/261; 174/350; 174/371; 257/419; 257/659; 349/149
(58) Field of Classification Search .................. 361/803, 361/721, 729, 730, 753, 800, 816, 818, 727, 361/784, 814, 749; 174/350, 371, 261; 257/419, 257/659; 349/149, 204
See application file for complete search history.

(56) References Cited

U.S. PATENT DOCUMENTS
4,203,147 A * 5/1980 Gabr ............................ 361/721
(Continued)

FOREIGN PATENT DOCUMENTS
EP    0695044 A2    1/1996
(Continued)

OTHER PUBLICATIONS

Supplementary European Search Report for EP 07 79 0940 completed Nov. 18, 2009.
(Continued)

*Primary Examiner* — Xiaoliang Chen

(57) ABSTRACT

Provided is a circuit board device, wherein degrees of freedom are provided for a GND connecting position among plural printed boards, and noise shield and/or heat sink effects are provided. An electronic device provided with the circuit board device and a GND connecting method are also provided. Circuit board device (100) includes a pair of printed boards (110, 120), noise generating component (112) and/or heat generating component (122), and metal plate (140). Printed boards (110, 120) include mounting surfaces and GND connecting terminals (111, 121) arranged on the respective mounting surfaces, and the mounting surfaces are arranged to face each other. Noise generating component (112) and/or heat generating component (122) is mounted on the mounting surface of at least one of a pair of printed boards (110, 120). Metal plate (140) is arranged between the mounting surfaces of the pair of printed boards (110, 120), and is located at a distance from at least one of noise generating component (112) and heat generating component (122) so as to overlap with the noise generating component and/or the heat generating component. Furthermore, metal plate (140) is in contact with each of GND connecting terminals (111, 121) so that GND connecting terminals (111, 121) are electrically connected to each other.

5 Claims, 4 Drawing Sheets

U.S. PATENT DOCUMENTS

| | | | |
|---|---|---|---|
| 4,399,487 A * | 8/1983 | Neumann | 361/727 |
| 4,658,334 A * | 4/1987 | McSparran et al. | 361/800 |
| 5,053,924 A * | 10/1991 | Kurgan | 361/818 |
| 5,150,282 A * | 9/1992 | Tomura et al. | 361/818 |
| 5,253,146 A * | 10/1993 | Halttunen et al. | 361/784 |
| 5,438,482 A * | 8/1995 | Nakamura et al. | 361/816 |
| 5,564,096 A * | 10/1996 | Hama et al. | 455/300 |
| 5,566,053 A * | 10/1996 | Chou | 361/753 |
| 5,625,286 A * | 4/1997 | Kamiya | 324/156 |
| 5,636,105 A * | 6/1997 | Inomata et al. | 361/777 |
| 6,058,024 A * | 5/2000 | Lyford | 361/816 |
| 6,362,860 B1 * | 3/2002 | Sagawa | 349/59 |
| 6,840,686 B2 * | 1/2005 | Jiang et al. | 385/92 |
| 6,930,891 B1 * | 8/2005 | Hama et al. | 361/800 |
| 7,391,623 B2 * | 6/2008 | Kaito et al. | 361/807 |
| 2005/0052858 A1 * | 3/2005 | Shima | 361/814 |

FOREIGN PATENT DOCUMENTS

| | | |
|---|---|---|
| JP | 63-55483 A | 4/1988 |
| JP | 1993114792 A | 5/1993 |
| JP | 6-29684 A | 2/1994 |
| JP | 1995045982 A | 2/1995 |
| JP | 9-186481 A | 7/1997 |
| JP | 1999145650 A | 5/1999 |
| JP | 1999177278 A | 7/1999 |
| JP | 1999307968 A | 11/1999 |
| JP | 2001085884 A | 3/2001 |
| JP | 2003115564 A | 4/2003 |
| JP | 2004071629 A | 3/2004 |

OTHER PUBLICATIONS

International Search Report for PCT/JP2007/064186 mailed Aug. 14, 2007.

Japanese Office Action for JP2006-198386 issued Jun. 24, 2011.

* cited by examiner

CIRCUIT BOARD DEVICE, ELECTRONIC DEVICE PROVIDED WITH THE SAME, AND GND CONNECTING METHOD

This application is the National Phase of PCT/JP2007/064186, filed Jul. 18, 2007, which claims priority to Japanese Patent Application No. 2006-198386, filed on Jul. 20, 2006, the entire contents of which are incorporated herein by reference.

TECHNICAL FIELD

The present invention relates to a circuit board device with a printed board, an electronic device provided with the circuit board device, and a GND connecting method.

BACKGROUND ART

In recent years, because of miniaturization and design consideration, there is a need for more effective mounting methods for circuit board devices that are used in electronic devices such as mobile telephone terminals. In order to meet this need, there is a method for overlapping two printed boards to improve the mounting efficiency. In this case, GNDs of the two printed boards must be connected to each other so that the GNDs of the two printed boards have the same electric potential. As illustrated in FIG. 5, in case the GNDs of first printed board 210 and second printed board 220 are connected to each other, there is typically used a method of connecting the GNDs directly by means of GND connecting spring terminal 211 or the like.

Further, there is a need to prevent noise interference between the printed boards, the noise interference being caused by the proximity between the two printed boards, and there is a need to avoid effects of heat transfer such as heat conduction. Thus, as illustrated in FIG. 6, the following measures are taken in which noise generating component 311 is covered with metal shield 312 or in which a heat sink in a heat generating component is arranged so as to release the heat (regarding the heat release, refer to, for example, on page 2 or in FIG. 6 of Japanese Patent Application Laid-Open No. H11-307968).

DISCLOSURE OF THE INVENTION

However, as illustrated in FIG. 5, when the GNDs of the two printed boards are connected to GND connecting spring terminal 211, there is a need to arrange GND connecting spring terminal 211 on the one printed board (in this case, first printed board 210), and then there is a need to adjust a position of GND connecting spring terminal 211 to a position of the GND of the other printed board (in this case, second printed board 22). Accordingly, there occurs a limitation on the mounting of components.

Further, in order to avoid the noise interference between the two printed boards and the effects of heat transfer, metal shield 312 and heat sink must be prepared for each component that is mounted on each printed board. Consequently, the mounting space of the circuit board device increases, and also the cost increases.

In order to address the above circumstances, the present invention has been devised and its exemplary object is to provide: a circuit board device in which degrees of freedom are provided for a GND connecting position among plural printed boards, and at least one effect of noise shield and heat sink is provided; an electronic device provided with the circuit board device; and a GND connecting method.

In order to achieve the above object, the present invention provides a circuit board device comprising: a pair of printed boards, each of the pair of printed boards including a mounting surface and a GND connecting terminal provided on the mounting surface, and the pair of printed boards being arranged so that the mounting surfaces of the pair of printed boards face each other; at least one of a noise generating component and a heat generating component, at least one of the noise generating component and the heat generating component being mounted on the mounting surface of at least one of the pair of printed boards; and a metal plate that is provided between the mounting surfaces of the pair of printed boards and that is located at a distance from the noise generating component and/or the heat generating component so as to overlap with the noise generating component and/or the heat generating component, and the metal plate being in contact with the respective GND connecting terminals so that the GND connecting terminals of the pair of printed boards are electrically connected to each other.

According to the present invention, the circuit board device further comprises a holding member, wherein: the holding member includes a plate-like portion arranged between the pair of printed boards, and the holding member holds the pair of printed boards so that the pair of printed boards are arranged at a substantially constant distance from each other; the metal plate is arranged between the mounting surface of one of the pair of printed boards and the plate-like portion of the holding member; and a hole, through which the GND connecting terminal that is provided on the other of the pair of printed boards passes, is formed in the holding member.

According to the present invention, the metal plate functions so that the GND connecting terminals of the pair of printed boards are electrically connected to each other, and the metal plate functions so that noise that is generated by the noise generating component is blocked by the metal plate, and/or the metal plate functions so that heat that is generated by the heat generating component is dispersed by the metal plate.

According to the present invention, the metal plate is made of a metal material or a conductive resin material.

According to the present invention, there is provided an electronic device provided with the circuit board device including the above configuration.

According to the present invention, there is provided a GND connecting method comprising: arranging a pair of printed boards, each of the pair of printed boards including a mounting surface and a GND connecting terminal provided on the mounting surface, so that the mounting surfaces of the pair of printed boards face each other; mounting at least one of a noise generating component and a heat generating component on the mounting surface of at least one of the pair of printed boards; arranging a metal plate between the mounting surfaces of the pair of printed boards, the metal plate being located at a distance from at least one of the noise generating component and the heat generating component so that the metal plate overlaps with at least one of the noise generating component and the heat generating component; and bringing the metal plate into contact with the GND connecting terminals of the pair of printed boards so that the GND connecting terminals of the pair of printed boards are electrically connected to each other.

According to the present invention, the GND connecting method comprises: arranging a holding member that includes a plate-like portion arranged between the pair of printed boards, the holding member holding the pair of printed boards so that the pair of printed boards are arranged at a substantially constant distance from each other; arranging the metal plate between the mounting surface of one of the pair of printed boards and the plate-like portion of the holding member; forming a hole in the holding member, wherein the GND connecting terminal that is provided on the other of the pair of printed boards passes through the hole; and bringing the metal plate into contact with the GND connecting terminal that is provided on the other of the pair of printed boards through the hole.

According to the present invention, the GND connecting method further comprises: electrically connecting the GND connecting terminals of the pair of printed boards each other by means of the metal plate; and blocking noise that is generated by the noise generating component by means of the metal plate, and/or dispersing heat that is generated by the heat generating component by means of the metal plate.

Hence, according to the present invention, the metal plate having a predetermined shape is arranged between the pair of printed boards arranged to face each other, whereby the GND connecting position between the pair of printed boards can be set freely in a range that is capable of being connected to the metal plate. Therefore, the degrees of freedom of positions at which the GND connecting terminal is mounted on the printed board can be increased. Further, the metal plate is arranged at a distance from the noise generating component and/or the heat generating component so as to overlap with the noise generating component and/or the heat generating component, and thus the metal plate can function as a noise shield and/or heat sink.

The circuit board device according to the present invention, the electronic device provided with the circuit board device, and the GND connecting method have the following advantageous effects.

The first advantageous effect of the present invention is that the position, at which the GND connecting terminals are mounted on the pair of printed boards that are arranged to face each other, can be set freely. The reason for this is that the metal plate is inserted between the pair of printed boards, whereby the GND connecting terminals of the printed boards can be connected at any position of the metal plate.

The second advantageous effect of the present invention is that the space in which the circuit board device is mounted can be efficiently used, and cost reduction can be achieved. The reason for this is that noise interference between the printed boards can be reduced by the metal plate that is inserted between the pair of printed boards, and thus it is not necessary to mount a metal shield for each noise generating component. Further, the reason for this is that heat transfer between the printed boards can be reduced by the metal plate that is inserted between the pair of printed boards, and thus it is not necessary to mount a heat sink for each heat generating component.

BEST MODE FOR CARRYING OUT THE INVENTION

A circuit board device according to an exemplary embodiment includes: a pair of printed boards, each of the pair of printed boards including a mounting surface and a GND connecting terminal provided on the mounting surface, and the pair of printed boards being arranged so that the mounting surfaces of the pair of printed boards face each other; at least one of a noise generating component and a heat generating component, at least one of the noise generating component and the heat generating component being mounted on the mounting surface of at least one of the pair of printed boards; and a metal plate that is provided between the mounting surfaces of the pair of printed boards and that is located at a distance from the noise generating component and/or the heat generating component so as to overlap with the noise generating component and/or the heat generating component, and the metal plate being in contact with the respective GND connecting terminals so that the GND connecting terminals of the pair of printed boards are electrically connected to each other. Thus, the degrees of freedom of positions on the printed board on which the GND connecting terminal is mounted can be increased. Further, since the metal plate functions as a noise shield and/or heat sink, the space in which the circuit board device is mounted can be efficiently used, and cost reduction can be achieved.

Figure 1:
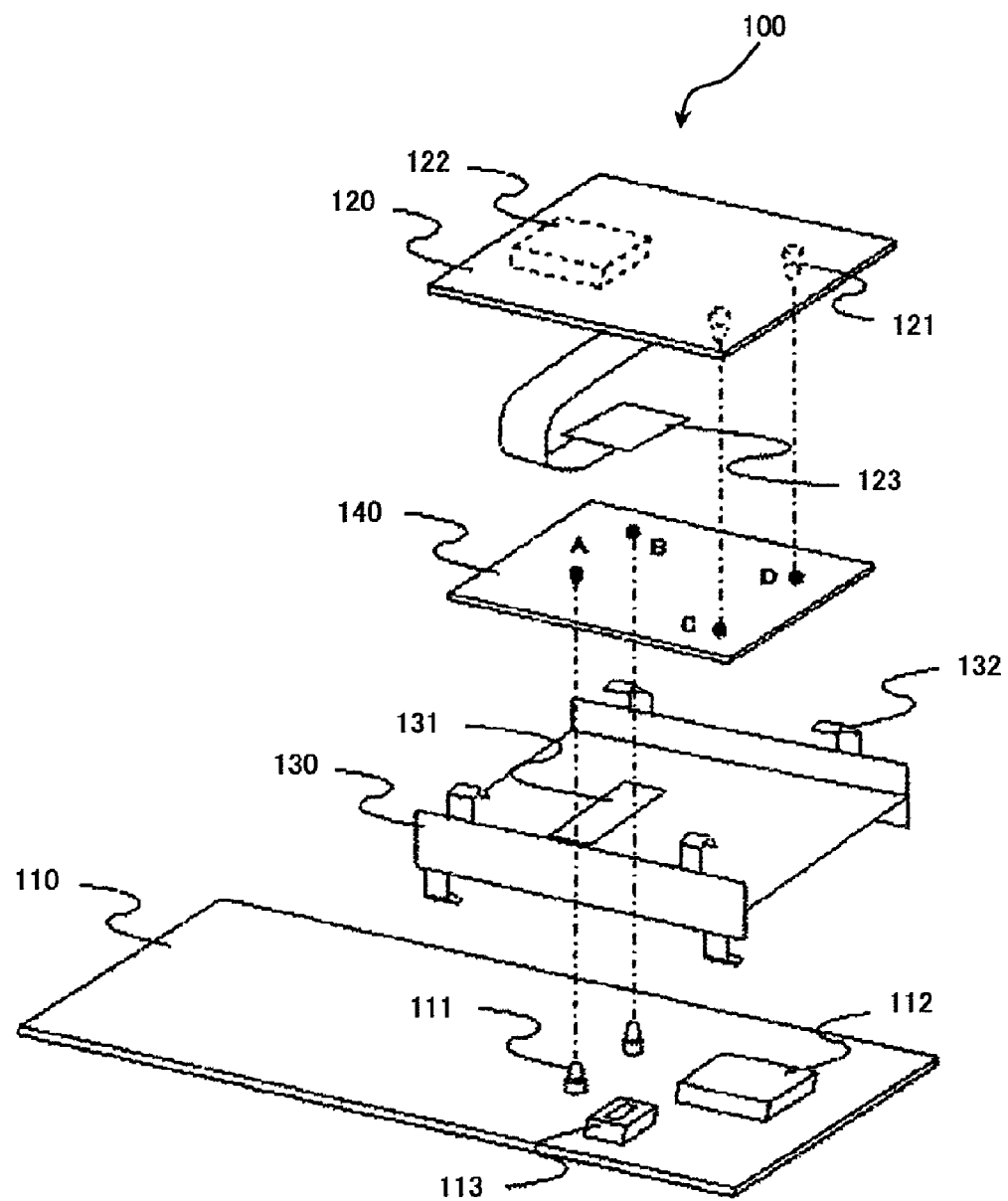
FIG. 1 is a perspective view schematically illustrating a GND connecting structure of a circuit board device according to an exemplary embodiment.
Figure 2:
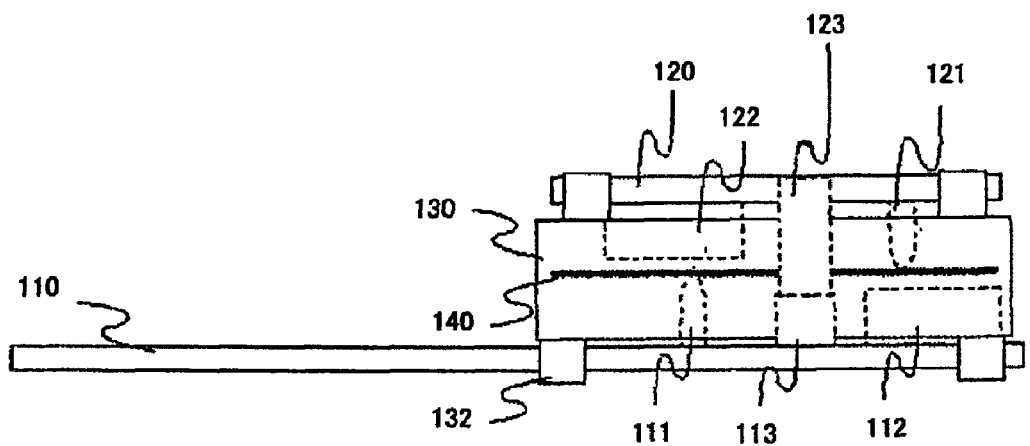
FIG. 2 is a side view illustrating a state in which the circuit board device according to the exemplary embodiment has been assembled.
Figure 3:
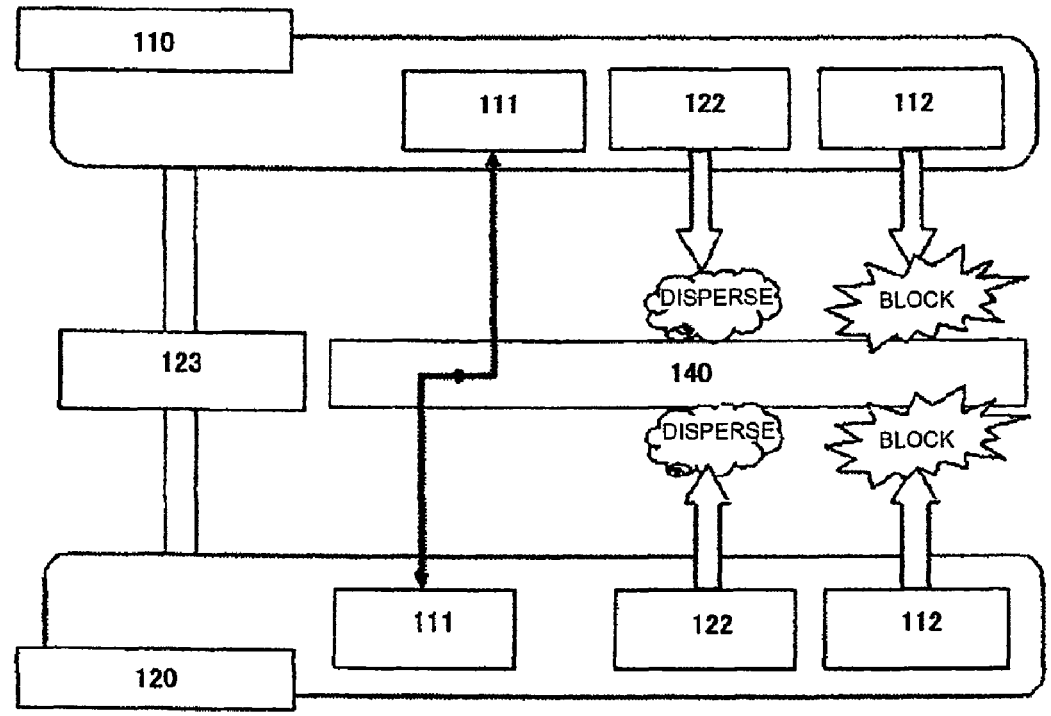
FIG. 3 is a view for explaining advantageous effects that are achieved by a GND connecting method for the circuit board device according to the exemplary embodiment.
Figure 4:
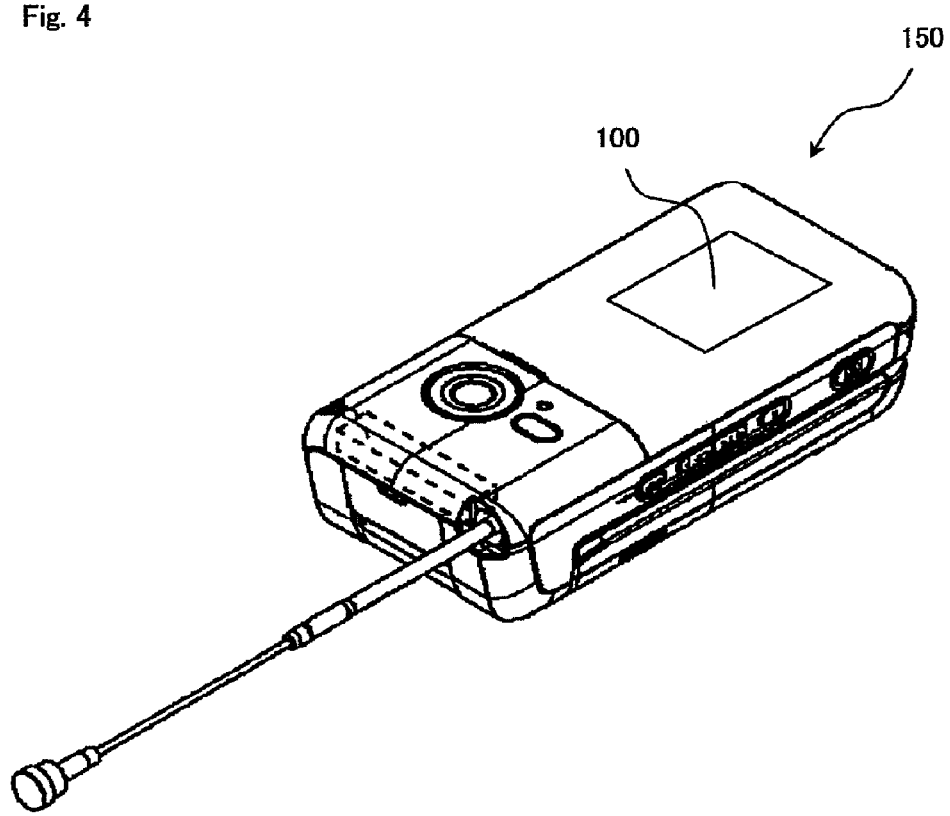
FIG. 4 is a perspective view schematically illustrating an electronic device provided with the circuit board device according to the exemplary embodiment.
Figure 5:
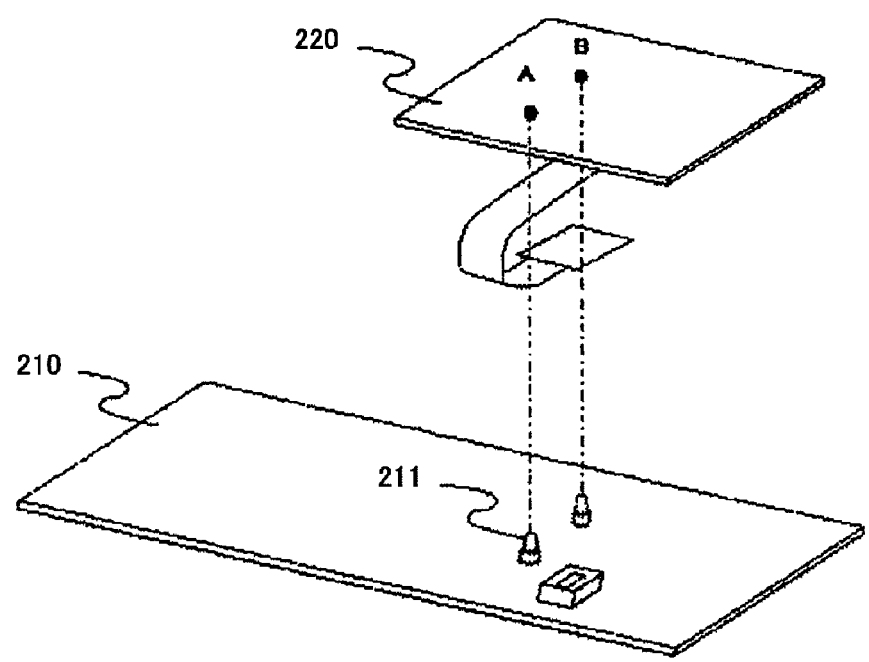
FIG. 5 is a perspective view schematically illustrating a GND connecting structure of a related printed board.
Figure 6:
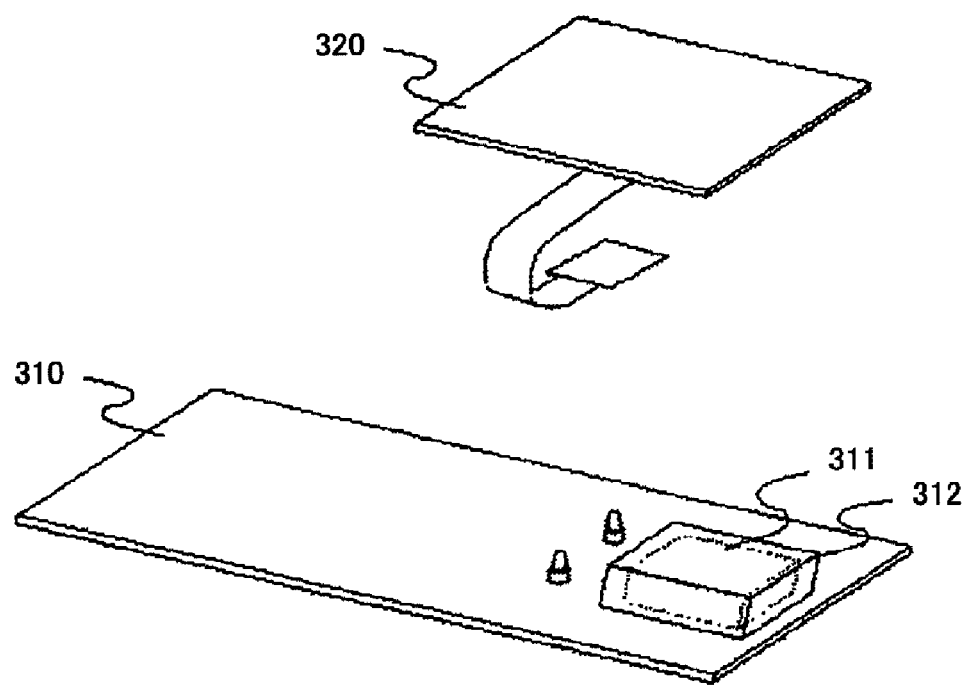
FIG. 6 is a perspective view schematically illustrating a noise preventing structure of a related printed board.

In order to describe the exemplary embodiment more in detail, a circuit board device according to the exemplary embodiment, an electronic device provided with the circuit board device, and a GND connecting method for the circuit board device will be described in detail with reference to FIGS. 1 to 4. FIG. 1 is a perspective view schematically illustrating a GND connecting structure of a circuit board device according to an exemplary embodiment. FIG. 2 is a side view illustrating a state in which the circuit board device according to this exemplary embodiment has been assembled. FIG. 3 is a view for explaining advantageous effects that are achieved by a GND connecting method for the circuit board device according to this exemplary embodiment. FIG. 4 is a perspective view schematically illustrating an electronic device provided with the circuit board device according to this exemplary embodiment.

Circuit board device 100 includes, as illustrated in FIG. 1, first printed board 110, second printed board 120, metal plate 140 functioning as a conductive member, and printed board fixing frame 130. Second printed board 120 is arranged so as to face first printed board 110. Metal plate 140 is arranged between first printed board 110 and second printed board 120. Printed board fixing frame 130 functioning as a holding member fixes metal plate 140 and holds two printed boards 110 and 120 so that printed boards 110 and 120 are substantially parallel to each other.

One or more (in this example, two) GND connecting spring terminals 111, at least one noise generating component 112 and connector 113 are mounted on a mounting surface of first printed board 110. GND connecting spring terminal 111 functions as a connector used to connect GND. Noise generating component 112 is a noise generating source. Connector 113 is used so that first printed board 110 is connected to another board such as second printed board 120, or so that first printed board 110 is connected to an external device.

Meanwhile, one or more (in this example, two) GND connecting spring terminals 121, at least one heat generating component 122 and flexible substrate 123 are mounted on a mounting surface of second printed board 120. GND connecting spring terminals 121 functions as a connector that is used to connect GND. Heat generating component 122 is a heat generating source. Flexible substrate 123 that includes a plate-like portion is used so as to connect second printed board 120 to another board such as first printed board 110 or so as to connect second printed board 120 to an external device. In this example, flexible substrate 123 is connected to connector 113 on first printed board 110 and transmits electrical signals between the printed boards.

Side walls of printed board fixing frame 130 facing each other are orthogonal to the respective mounting surfaces of first printed board 110 and second printed board 120. At least two claws 132 are arranged at the front end portion of the side wall. First printed board 110 and second printed board 120 are fixed to printed board fixing frame 130 by means of claws 132. Hole 131 is formed in printed board fixing frame 130 so that GND connecting spring terminal 111 on first printed board 110 is connected to metal plate 140.

The material or shape of printed board fixing frame 130 is not limited to the configuration of FIG. 1, provided that printed board fixing frame 130 has the function of holding first printed board 110 and second printed board 120 so that they are arranged substantially parallel to each other. In FIG. 1, first printed board 110 and second printed board 120 are fixed to printed board fixing frame 130 by means of claw 132. However, the present invention is not limited to this structure, and another holding structure method such as screw cramp or fit may be used.

Metal plate 140 is arranged between printed board fixing frame 130 and the mounting surface of the one board (in this example, second printed board 120). Metal plate 140 is arranged at a distance from noise generating component 112 on first printed board 110 and/or heat generating component 122 on second printed board 120 and contains an area that coincides with components 112 and 122. Metal plate 140 is in contact with GND connecting spring terminal 111 of first printed board 110 and GND connecting spring terminal 121 of second printed board 120, whereby GND connecting spring terminal 111 and GND connecting spring terminal 121 can be electrically connected to each other.

Metal plate 140 may be made of an inexpensive metal material having a high electrical conductivity and thermal conductivity (for example, aluminum, copper or the like). Further, metal plate 140 may be made of a resin material instead of metal, the resin material having conductive property. The thickness of metal plate 140 can be appropriately set according to its electrical conductivity and thermal conductivity. In addition, the shape of metal plate 140 is not limited to a rectangle. Namely, metal plate 140 can be changed to any configuration in which metal plate 140 is arranged at a distance from noise generating component 112 and/or heat generating component 122, and metal plate 140 overlaps with noise generating component 112 and/or heat generating component 122. Furthermore, metal plate 140 may be made of a single metal material or alternatively formed of a combination of multiple metal materials. For example, a portion of metal plate 140, which is in contact with GND connecting spring terminal, may be covered with a corrosion-inhibiting metal material, or may have a laminate structure that is obtained by overlapping multiple metal materials.

Circuit board device 100 according to this exemplary embodiment can be applied to electronic device 150 such as a mobile telephone terminal device (refer to FIG. 4).

The GND connecting method for circuit board device 100 according to this exemplary embodiment will be described. Firstly, noise generating component 112 and/or heat generating component 122 are mounted on the mounting surface of at least one of first and second printed boards 110 and 120. Further, the mounting surfaces of first and second printed boards 110 and 120 are arranged to face each other. Printed board fixing frame 130 is arranged between first and second printed boards 110 and 120. Metal plate 140 is arranged between the mounting surface of second printed board 120 and the plate-like portion of printed board fixing frame 130 at a distance from noise generating component 112 and/or heat generating component 122 so as to overlap with noise generating component 112 and/or heat generating component 122. GND connecting spring terminals 111 and 121 on first and second printed boards 110 and 120 are each brought into contact with metal plate 140 so that GND connecting spring terminals 111 and 121 are brought into electrically connected to each other. In this case, GND connecting spring terminal 111 on first printed board 110 in this exemplary embodiment is in contact with metal plate 140 through hole 131 formed in printed board fixing frame 130. With this configuration, GND connection is implemented in circuit board device 100.

The configuration of FIG. 1 is merely exemplary, and first printed board 110 and second printed board 120 can have any structure or size. FIG. 1 illustrates the configuration in which one noise generating component 112 is mounted on first printed board 110, and one heat generating component 122 on second printed board 120. However, the present invention is not limited this configuration. Namely, noise generating component 112 and/or heat generating component 122 may be mounted on any one of the printed boards. In FIG. 1, printed board fixing frame 130 and metal plate 140 are provided separately. However, printed board fixing frame 130 itself may be made of a metal material, for example, so that printed board fixing frame 130 functions as metal plate 140. In this case, hole 131 is eliminated, and GND connecting spring terminal 111 of first printed board 110 is directly brought into contact with printed board fixing frame 130.

FIG. 2 is obtained by assembling the components having the above configurations. GND connecting spring terminal 111 on first printed board 110 is in contact with metal plate 140 at points A and B, and GND connecting spring terminal 121 on second printed board 120 is in contact with metal plate 140 at points C and D. Consequently, GND connection between the two printed boards is made via metal plate 140.

In this way, metal plate 140 is arranged between first printed board 110 and second printed board 120, and GND connection between the two printed boards is realized through metal plate 140. Therefore, the positions of GND connecting spring terminals 111 and 121 can be set freely in a range that is at a distance from metal plate 140 and that overlaps with metal plate 140. Accordingly, the degrees of freedom of positions on the printed board on which the GND connecting terminal is mounted can be increased.

As illustrated in FIG. 3, noise, which is generated by noise generating component 112 mounted on first printed board 110, is blocked by metal plate 140. Therefore, noise interference between first printed board 110 and second printed board 120 can be reduced. Thus, it is not necessary to mount a metal shield for each noise generating component 112. Consequently, the space in which the circuit board device is mounted can be efficiently used, and cost reduction can be achieved.

Similarly, as illustrated in FIG. 3, heat, which is generated by and radiated from heat generating component 122 mounted on second printed board 120, is dispersed by metal plate 140. Accordingly, heat transfer to first printed board 110 can be reduced. Thus, it is not necessary to mount a heat sink for each heat generating component 122. Consequently, the space in which the circuit board device is mounted can be efficiently used, and cost reduction can be achieved.

The above exemplary embodiment in which first printed board 110 and second printed board 120 are used is described. However, the invention is not limited to this exemplary embodiment, and similarly can be applied to three or more printed boards.

The present invention has been described with reference to an exemplary embodiment. However, the invention is not limited to the exemplary embodiment. Those skilled in the art will recognize that many changes or modifications to the constitution and details of the invention are possible within the scope of the invention.

INDUSTRIAL APPLICABILITY

The present invention can be applied to a circuit board device provided with two or more printed boards, an electronic device provided with the circuit board device, and a GND connecting method for the circuit board device.

The invention claimed is:

1. A circuit board device comprising:
    a pair of printed boards, each of the pair of printed boards including a mounting surface and a GND spring connecting terminal provided on the mounting surface; and
    a metal plate that is provided between the mounting surfaces of the pair of printed boards, wherein:
    the pair of printed boards is arranged so that the mounting surfaces of the pair of printed boards face each other;
    the at least one of the noise generating component and the heating generating component is mounted on the mounting surface of at least one of the pair of printed boards;
    the metal plate is located at a distance from the at least one of the noise generating component and the heat generating component so as to overlap with the at least one of the noise generating component and the heat generating component;
    the GND spring connecting terminal provided on the mounting surface of a first printed board of the pair of printed boards comes into contact with the one surface of the metal plate facing the mounting surface of the first printed board, and the GND spring connecting terminal provided on the mounting surface of a second printed board of the pair of printed boards comes into contact with the other surface of the metal plate facing the mounting surface of the printed board to establish an electrical connection between the pair of printed boards;
    and the GND spring connecting terminal provided on the mounting surface of the first printed board and the GND spring connecting terminal provided on the mounting surface of the second printed board are separated from one another by a width of a flexible substrate that transmits an electrical signal between the first printed board and the second printed board.

2. The circuit board device according to claim 1, further comprising a holding member, wherein:
    the holding member includes a plate-like portion arranged between the pair of printed boards, and the holding member holds the pair of printed boards so that the pair of printed boards are arranged at a substantially constant distance from each other;
    the metal plate is arranged between the mounting surface of one of the pair of printed boards and the plate-like portion of the holding member; and
    a hole, through which the GND connecting terminal that is provided on the other of the pair of printed boards passes, is formed in the holding member.

3. The circuit board device according to claim 1, wherein the metal plate functions so that the GND connecting terminals of the pair of printed boards are electrically connected to each other, and
    the metal plate functions so that noise that is generated by the noise generating component is blocked by the metal plate, and/or the metal plate functions so that heat that is generated by the heat generating component is dispersed by the metal plate.

4. The circuit board device according to claim 1, wherein the metal plate is made of a metal material or a conductive resin material.

5. An electronic device comprising the circuit board device according to claim 1.

* * * * *